United States Patent [19]
Yamane et al.

[11] Patent Number: 6,020,229
[45] Date of Patent: Feb. 1, 2000

[54] SEMICONDUCTOR DEVICE METHOD FOR MANUFACTURING

[75] Inventors: Tomoko Yamane, Tokyo; Norihisa Arai, Omiya, both of Japan

[73] Assignee: Kabushiki Kaisha Toshiba, Kawasaki, Japan

[21] Appl. No.: 08/873,130

[22] Filed: Jun. 11, 1997

[30]     Foreign Application Priority Data

Jul. 17, 1996  [JP]  Japan ................................ 8-187598

[51] Int. Cl.[7] ................... H01L 21/8238; H01L 21/4763
[52] U.S. Cl. ......................... 438/201; 438/238; 438/258; 438/625; 438/592
[58] Field of Search ................................. 438/199–201, 438/209–211, 238, 239, 241, 257, 258, 275, 384, 385, 466, 592, 593, 250–252, 624, 634, 667, 637, 670, FOR 220, 625

[56]              References Cited

U.S. PATENT DOCUMENTS

| | | | |
|---|---|---|---|
| 4,651,406 | 3/1987 | Shimizu et al. | 438/258 |
| 4,663,825 | 5/1987 | Maeda | 438/659 |
| 5,084,416 | 1/1992 | Ozaki et al. | 438/624 |
| 5,087,589 | 2/1992 | Chapman et al. | 438/600 |
| 5,410,183 | 4/1995 | Murai | 257/750 |
| 5,489,547 | 2/1996 | Erdeljac et al. | 438/238 |
| 5,550,072 | 8/1996 | Cacharelis et al. | 438/241 |
| 5,686,329 | 11/1997 | Chang et al. | 438/304 |
| 5,716,863 | 2/1998 | Arai | 438/238 |
| 5,789,293 | 8/1998 | Cho et al. | 438/266 |
| 5,840,618 | 11/1998 | Kondo | 438/659 |

FOREIGN PATENT DOCUMENTS 4-318957   11/1992   Japan .

*Primary Examiner*—Michael Trinh
*Attorney, Agent, or Firm*—Banner & Witcoff, Ltd.

[57]              ABSTRACT

There are provided a semiconductor device and a method for manufacturing the same in which a thin film polysilicon film having a small parasitic capacitance which is required for attaining the high-speed operation and high reliability can be used as a resistance element, the process margin can be increased without increasing the number of manufacturing steps, and defects due to leakage between the resistance element and the underlying substrate can be eliminated so as to ensure the high manufacturing yield. In a semiconductor device having a conductive film formed over the surface of a semiconductor substrate with a first insulating film disposed therebetween and a metal wiring layer connected to the conductive film via a contact hole formed in a second insulating film which is formed on the conductive film, an etching stopper film having a selective etching ratio with respect to the second insulating film is formed in an area directly below the contact hole with a third insulating film disposed therebetween.

18 Claims, 11 Drawing Sheets

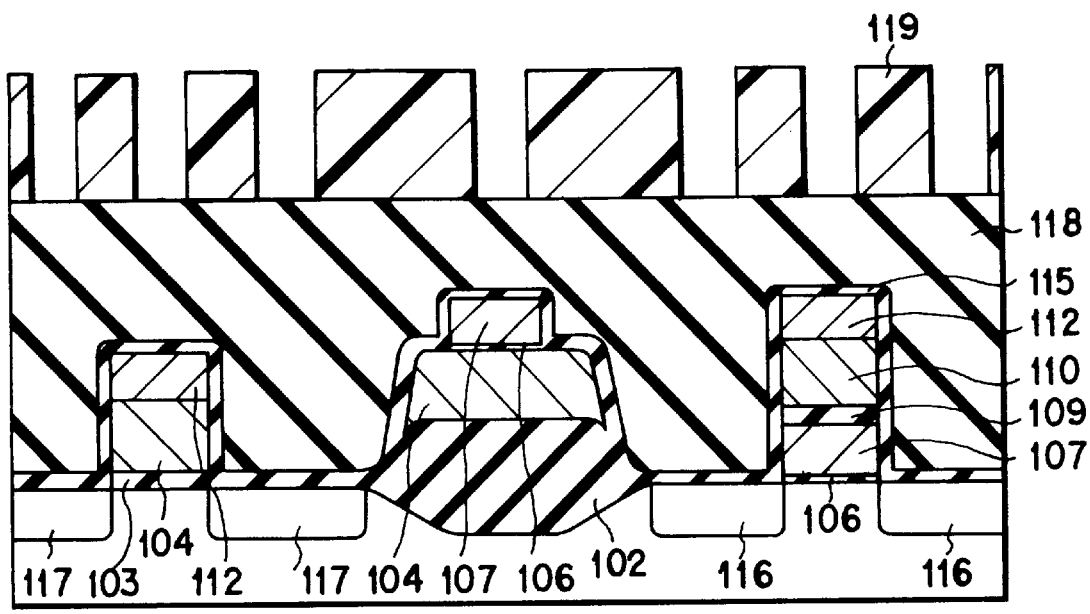
F I G. 6A
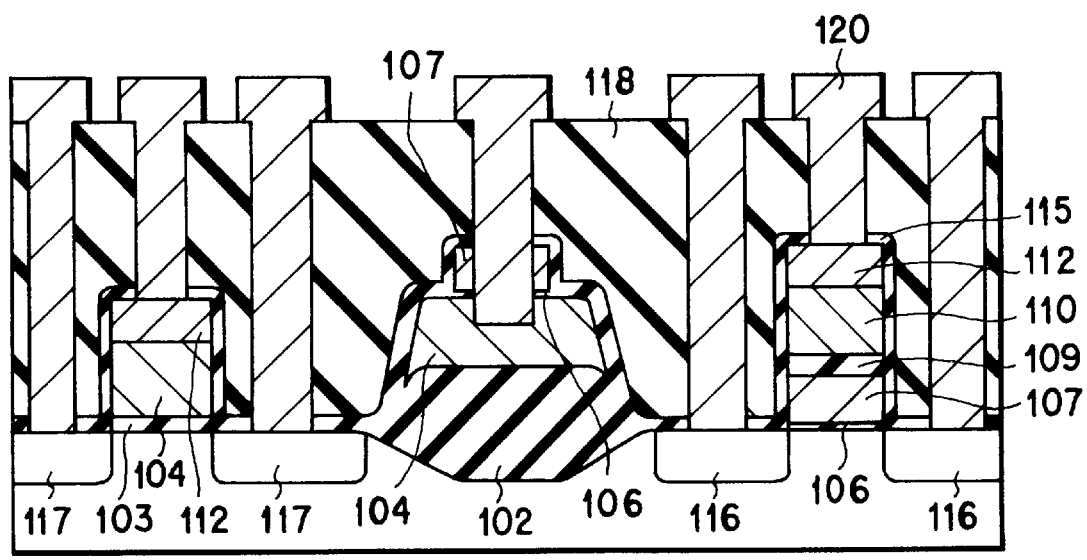
F I G. 6B

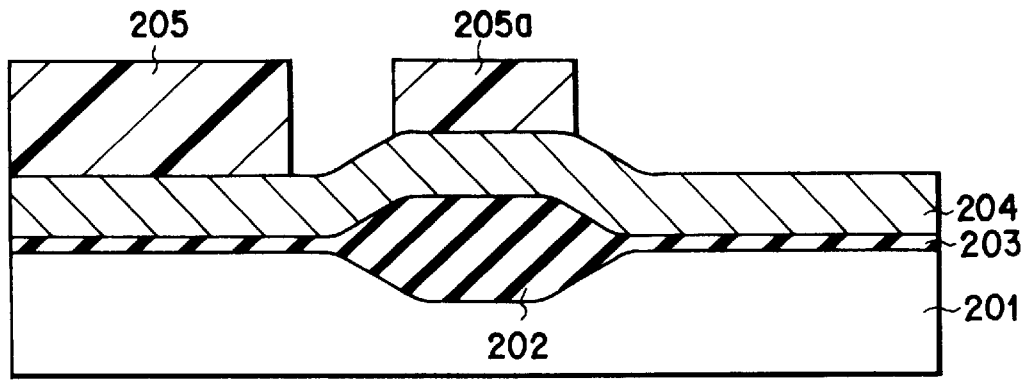
F I G. 7A
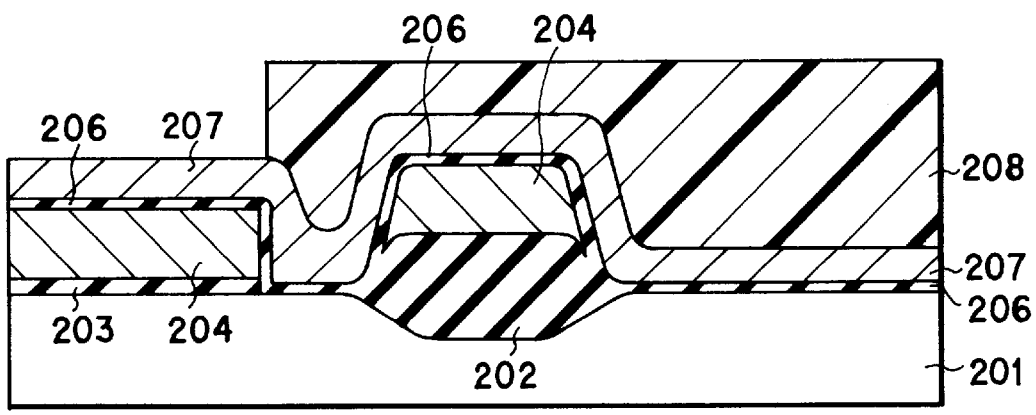
F I G. 7B
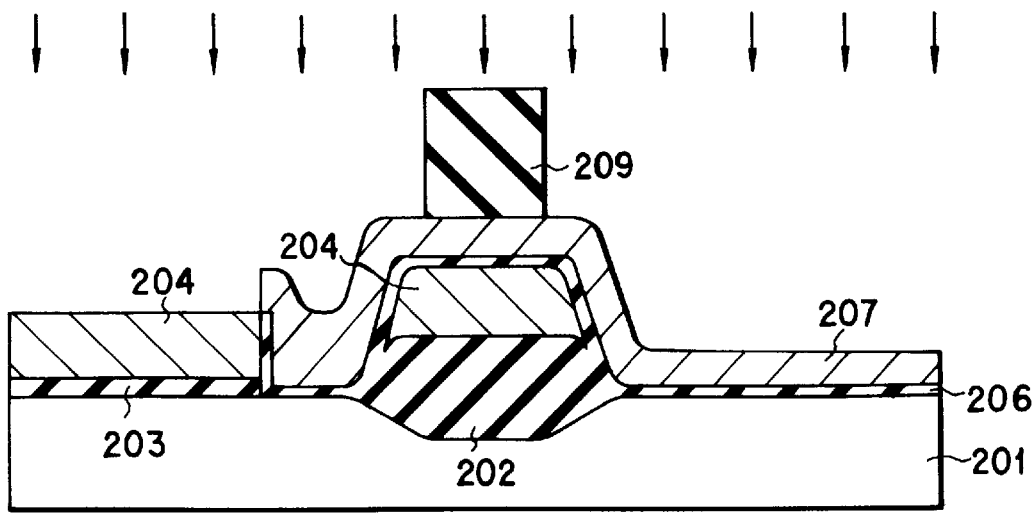
F I G. 7C

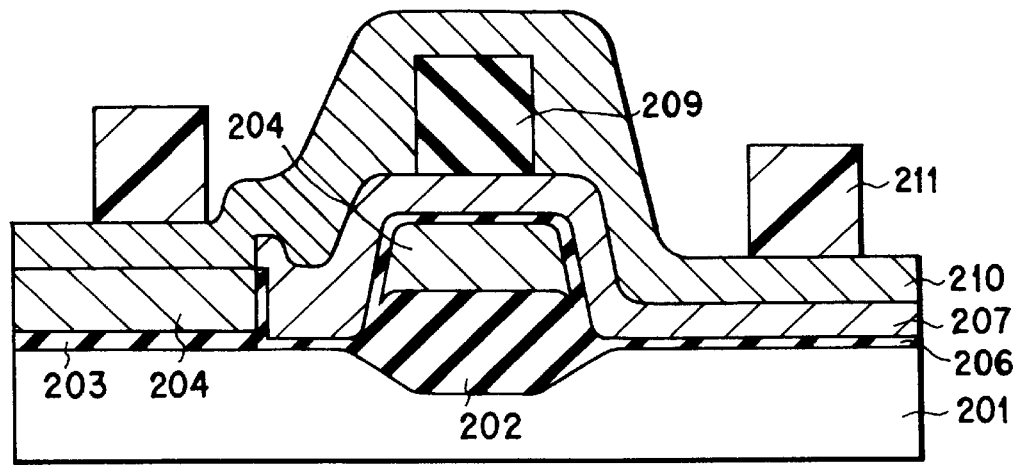
F I G. 8A
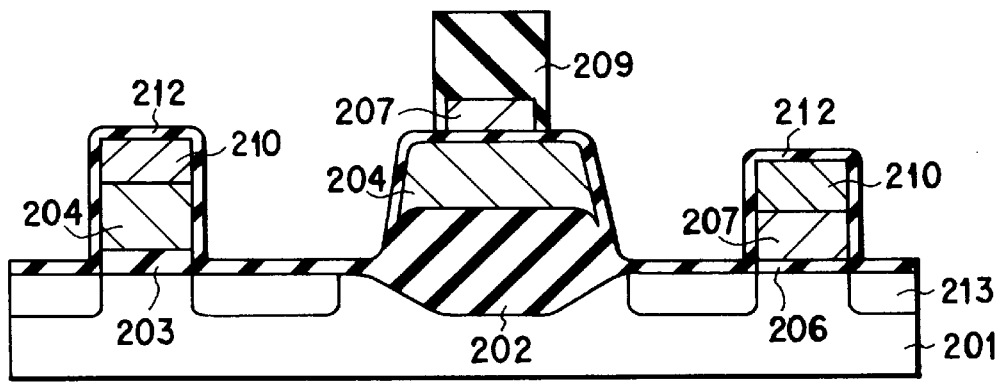
F I G. 8B
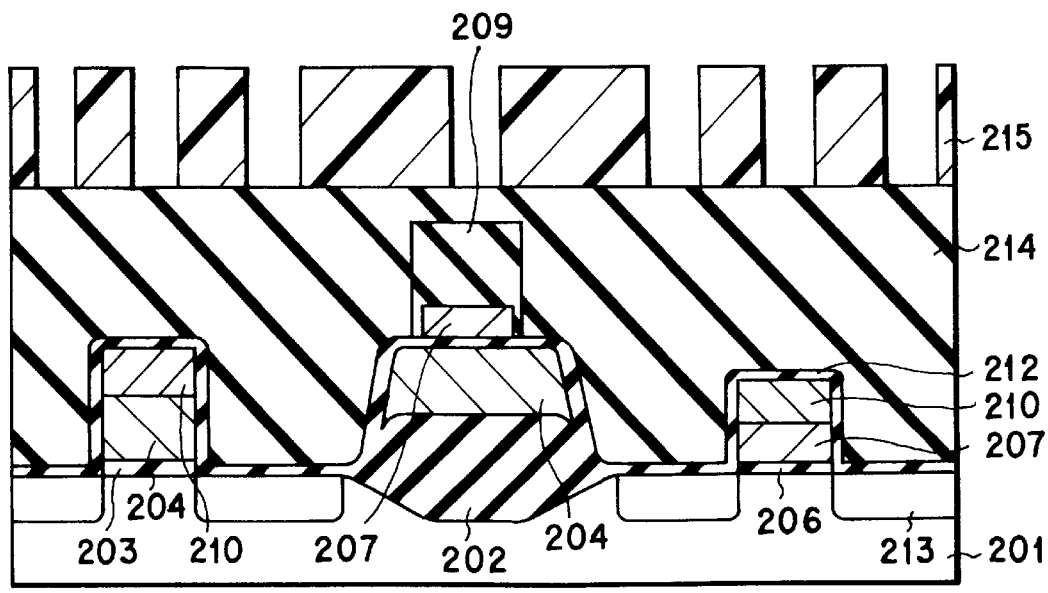
F I G. 8C

SEMICONDUCTOR DEVICE METHOD FOR MANUFACTURING

BACKGROUND OF THE INVENTION

This invention relates to a semiconductor device and a method for manufacturing the same, and more particularly to the structure of a contact area between a thin film conductive film and a metal wiring layer and a method for manufacturing the same and can be applied to a nonvolatile semiconductor memory and a method for manufacturing the same, for example.

Recently, it is strongly required to enhance the operation speed and integration density of semiconductor devices, and in order to meet the requirement, the size of the device tends to be reduced with the power source voltage kept unchanged. In other words, since the electric field in the device keeps increasing, the thickness of the gate oxide film cannot be reduced, particularly, in a nonvolatile semiconductor memory, since a high voltage is applied in the writing/erasing operation, the withstanding voltage of the gate oxide film becomes a problem.

Therefore, in the conventional nonvolatile semiconductor memory, a plurality of gate oxide films are used, thick gate oxide films are used for elements (which are hereinafter referred to as HV elements) to which a high power source voltage is applied, and gate oxide films which are thinner than the above thick gate oxide films are used for other elements (which are hereinafter referred to as LV elements, for example, nonvolatile memory cells) which are operated on a voltage lower than the above power source voltage.

On the other hand, in a case where a plurality of voltages are required in the device, devices having a plurality of external power sources are widely and frequently used. In such a device, a resistance type source voltage dividing system using high-resistance elements is often used in order to selectively divide a plurality of external power source voltages into a plurality of power source voltages in the device.

A method using a polysilicon film for the floating gate of a nonvolatile memory cell as the high-resistance element in the nonvolatile memory is known in the art and the method is explained below with reference to FIGS. 1A to 3B.

First, as shown in FIG. 1A, an element isolation insulating film 302 is formed on a semiconductor substrate 301 and a gate oxide film 303 for HV element is formed on that portion of the semiconductor substrate 301 on which the element isolation insulating film 302 is not formed. Then, a polysilicon film 304 is formed and a resist pattern 305 is formed on the polysilicon film in a peripheral element forming area.

After this, portions of the polysilicon film 304 and silicon oxide film 303 which lie in an area other than the HV element forming area are selectively removed by etching with the resist pattern 305 used as a mask and then the resist pattern 305 is removed.

Next, as shown in FIG. 1B, after a silicon oxide film 306 used for LV element is formed, a polysilicon film 307 is formed and a resist pattern 308 is formed on the polysilicon film in an LV element (cell and high-resistance element) forming area.

Then, portions of the polysilicon film 307 and silicon oxide film 306 which lie in an area other than the LV element (cell and high-resistance element) forming area are selectively removed by etching with the resist pattern 308 used as a mask and then the resist pattern 308 is removed.

Next, as shown in FIG. 1C, an $SiO_2$ film 309 and a polysilicon film 310 are formed, for example, on the entire surface (not necessarily on the entire surface) of the polysilicon film 307 and polysilicon film 304 and then a resist pattern 311 is formed on the polysilicon film 310 in the LV element forming area.

Then, as shown in FIG. 2A, portions of the polysilicon film 310 and $SiO_2$ film 309 are selectively removed by etching with the resist pattern 311 used as a mask and then the resist pattern 311 is removed.

Next, a WSi film 312 is formed on the entire surface (not necessarily on the entire surface) and a resist pattern 313 is formed on the WSi film in the HV element forming area and the cell forming area. After this, portions of the WSi film 312 and polysilicon films 310, 304 are selectively removed by etching with the resist pattern 313 used as a mask as shown in FIG. 2B.

Then, a resist pattern 314 is formed on a portion in an area other than the cell forming area without removing the resist pattern 313. After this, as shown in FIG. 2C, portions of the $SiO_2$ film 309 and polysilicon film 307 are selectively removed by etching with the resist patterns 313, 314 used as a mask and then the resist patterns 313, 314 are removed. After this, a post-oxidation process is effected to form an $SiO_2$ film 315 and then diffusion layers 316 of the cells and diffusion layers 317 of the peripheral elements are formed.

Next, as shown in FIG. 3A, an $SiO_2$ film 318 is formed on the entire surface of the structure, a resist pattern 319 is formed on a portion in an area other than the contact areas and contact holes are formed by etching with the resist pattern 319 used as a mask.

After the resist pattern 319 is removed, aluminum wirings 320 are formed as shown in FIG. 3B.

It is desirable that a resistance element be formed with sufficiently high resistance and it is required to reduce the parasitic capacitance in order to attain a high-speed operation. In order to meet the above requirement, the film thickness of the polysilicon film used as the resistance element must be reduced. This also applies to the device explained before as the conventional device, and it becomes more desirable as the film thickness of the polysilicon film 307 which is partly used as the resistance element is reduced.

However, in the above-described conventional case, the contact holes shown in FIG. 3B may penetrate the polysilicon film 307 for the resistance element which is made sufficiently thin when the contact holes are formed by etching, and in the worst case, it becomes impossible to maintain insulation between the underlying substrate and the resistance element, thereby causing the manufacturing yield to be lowered.

Therefore, it is a common practice to form the polysilicon film 307 for the resistance element having a film thickness which is as large as approx. 200 nm even though the parasitic capacitance of the resistance element is increased and this imposes a limitation on the high-speed operation of the device.

Further, even if the film thickness of the polysilicon film 307 for the resistance element is increased to some extent, penetration of the contact hole cannot be sufficiently prevented because of a fluctuation in the etching process, thereby causing the manufacturing yield to be lowered.

BRIEF SUMMARY OF THE INVENTION

As described above, in the conventional semiconductor device and the method for manufacturing the same, if the film thickness of the polysilicon film for the resistance element is reduced to attain the high-speed operation and high reliability, a contact hole used for connecting a wiring to the resistance element may penetrate the resistance element when the contact hole is formed by etching, thereby causing the manufacturing yield to be lowered.

This invention has been made to solve the above problem, and an object of this invention is to provide a semiconductor device and a method for manufacturing the same in which a thin polysilicon film having a small parasitic capacitance which is required for attaining the high-speed operation and high reliability can be used as a resistance element, the process margin can be increased without increasing the number of manufacturing steps, and defects due to leakage between the resistance element and the underlying substrate can be eliminated so as to ensure the high manufacturing yield.

A semiconductor device of this invention comprises a first insulating film formed on a semiconductor substrate; a first conductive film formed above the first insulating film; a second insulating film formed on the first conductive film; a metal wiring layer connected to the first conductive film via contact holes formed in the second insulating film; etching stopper films formed on the first insulating film in an area lying directly under the contact hole and having a selective etching ratio with respect to the second insulating film; and a third insulating film formed between the etching stopper films and the first conductive film.

A method for manufacturing a semiconductor device of this invention comprises the steps of forming a first gate insulating film on the surface of a semiconductor substrate; forming a first polysilicon film used for forming etching stopper film on the first gate insulating film; forming a first resist pattern on a forming area of the etching stopper film; removing a portion of the first polysilicon film which lies in an area other than the forming area of the etching stopper film and patterning the etching stopper film with the first resist pattern used as a mask; removing the first resist pattern; forming a second polysilicon film above the semiconductor substrate and the etching stopper film; forming a second resist pattern used for patterning the second polysilicon film; patterning the second polysilicon film with the second resist pattern used as a mask; removing the second resist pattern and then forming an inter-level insulating film on the entire surface; forming a contact hole which reach the second polysilicon film lying directly above the etching stopper film in the inter-level insulating film; and forming a metal wiring layer which is formed in contact with the second polysilicon film via the contact hole on the inter-level insulating film.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 6A is a cross sectional view for illustrating a manufacturing step following the manufacturing step of FIG. 5C;

FIG. 6B is a cross sectional view for illustrating a manufacturing step following the manufacturing step of FIG. 6A;

FIG. 7A is a cross sectional view for illustrating one step of a process for manufacturing a semiconductor device according to a second embodiment of this invention;

FIG. 7B is a cross sectional view for illustrating a manufacturing step following the manufacturing step of FIG. 7A;

FIG. 7C is a cross sectional view for illustrating a manufacturing step following the manufacturing step of FIG. 7B;

FIG. 8A is a cross sectional view for illustrating a manufacturing step following the manufacturing step of FIG. 7C;

FIG. 8B is a cross sectional view for illustrating a manufacturing step following the manufacturing step of FIG. 8A;

FIG. 8C is a cross sectional view for illustrating a manufacturing step following the manufacturing step of FIG. 8B;

DETAILED DESCRIPTION OF THE INVENTION

There will now be described embodiments of this invention with reference to the accompanying drawings.

FIGS. 4A to 6B show part of the substrate cross section in the main steps of a method for manufacturing a nonvolatile memory according to a first embodiment of this invention.

In the nonvolatile memory, transistors for a peripheral circuit (peripheral transistors) to which a high power source voltage is applied, two-layered polysilicon type memory cells to which a power source voltage lower than the power source voltage applied to the peripheral transistors is applied, and resistance elements used for setting a power source voltage on which the memory cells can be operated are formed on the same substrate.

The manufacturing process for the above nonvolatile memory is explained below.

Figure 1A:
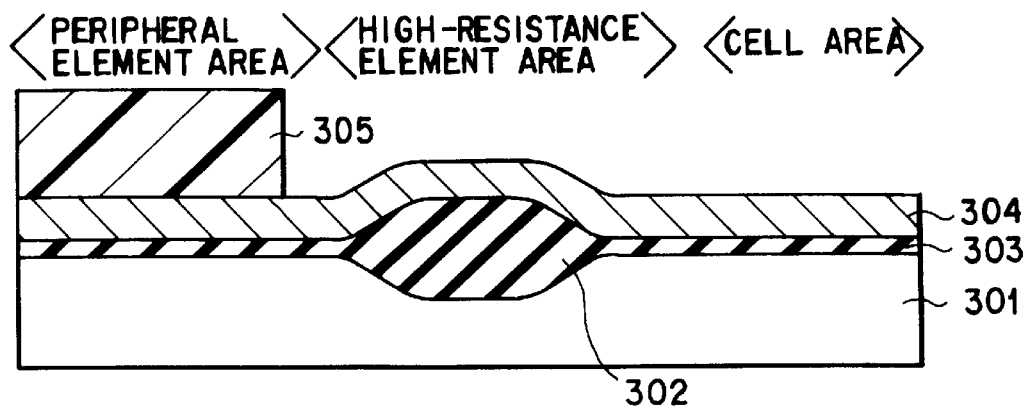
FIG. 1A is a cross sectional view for illustrating one step of a process for manufacturing a conventional nonvolatile memory.
Figure 1B:
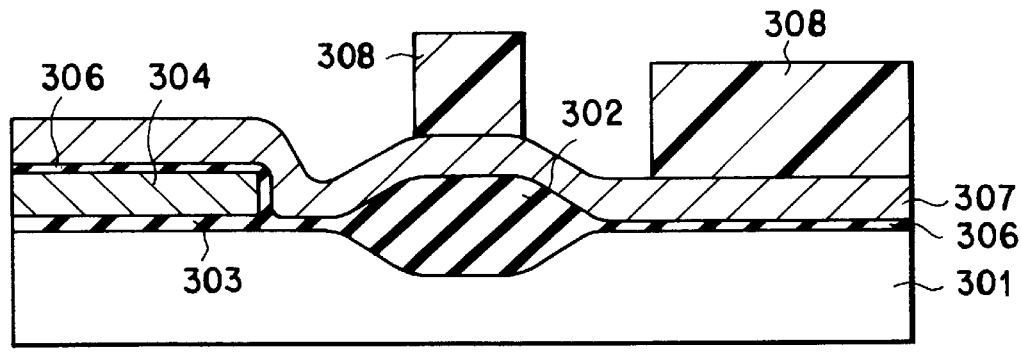
FIG. 1B is a cross sectional view for illustrating a manufacturing step following the manufacturing step of FIG. 1A.
Figure 1C:
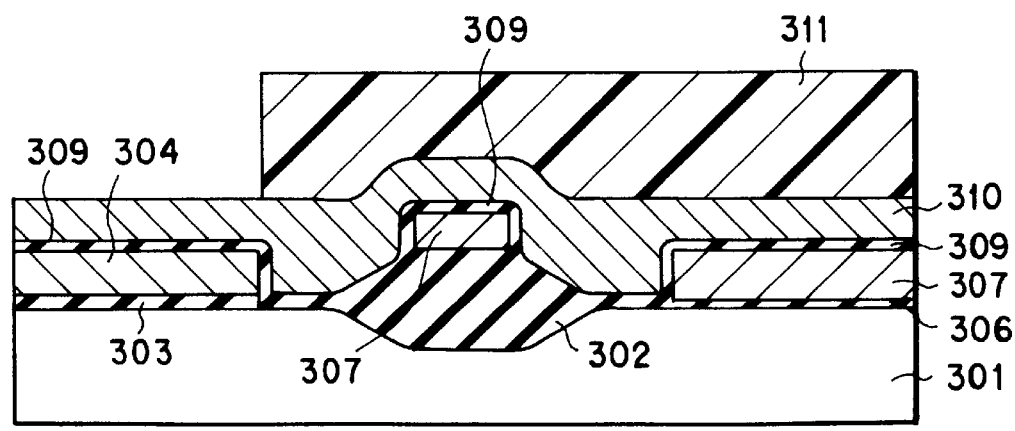
FIG. 1C is a cross sectional view for illustrating a manufacturing step following the manufacturing step of FIG. 1B.
Figure 2A:
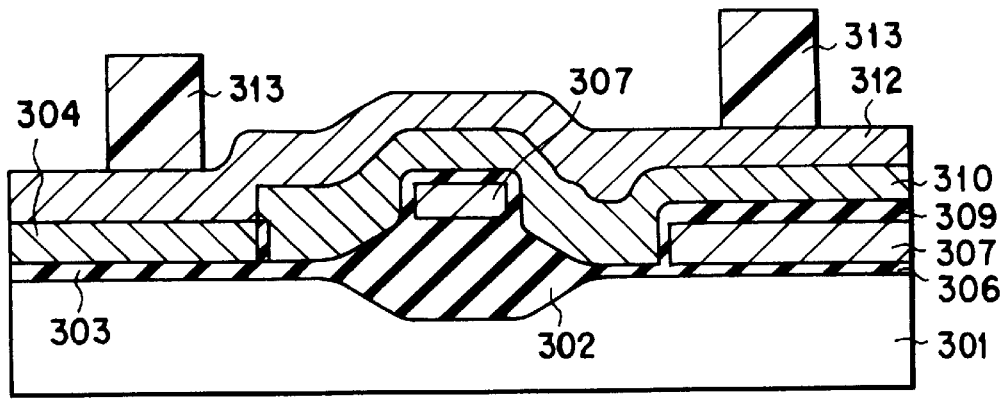
FIG. 2A is a cross sectional view for illustrating a manufacturing step following the manufacturing step of FIG. 1C.
Figure 2B:
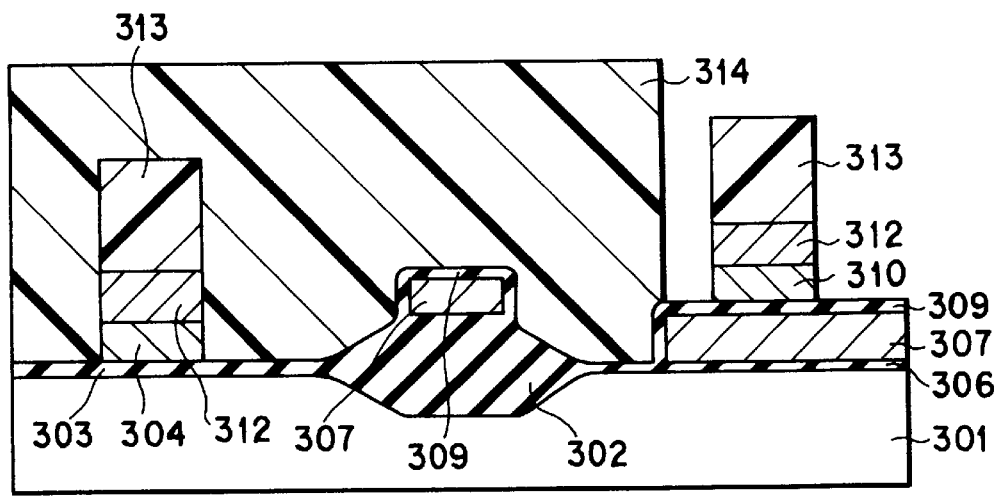
FIG. 2B is a cross sectional view for illustrating a manufacturing step following the manufacturing step of FIG. 2A.
Figure 2C:
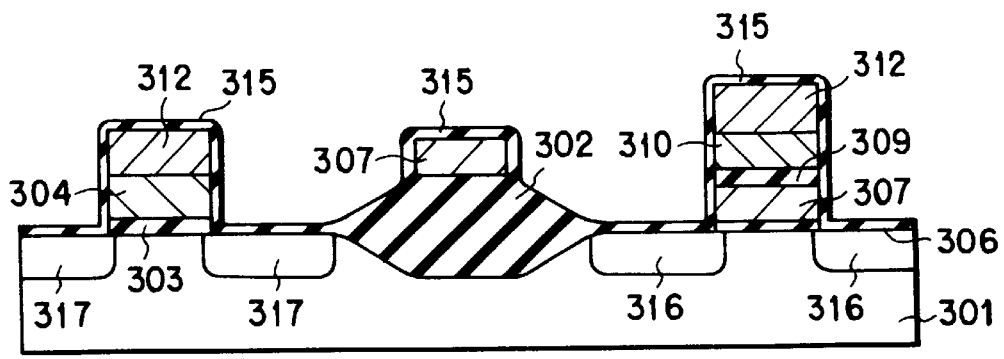
FIG. 2C is a cross sectional view for illustrating a manufacturing step following the manufacturing step of FIG. 2B.
Figure 3A:
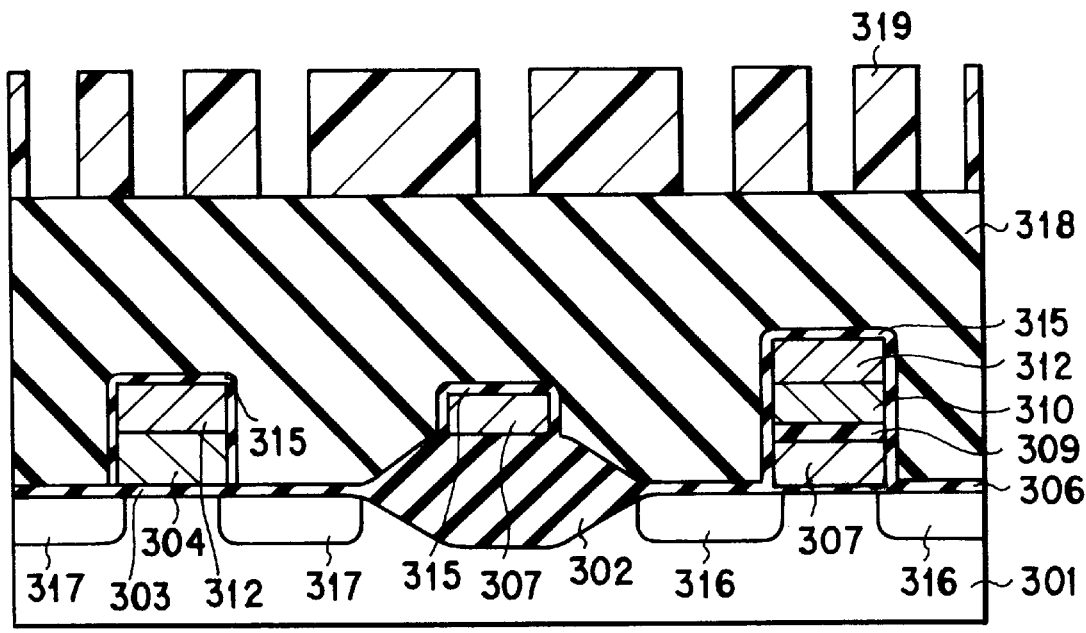
FIG. 3A is a cross sectional view for illustrating a manufacturing step following the manufacturing step of FIG. 2C.
Figure 3B:
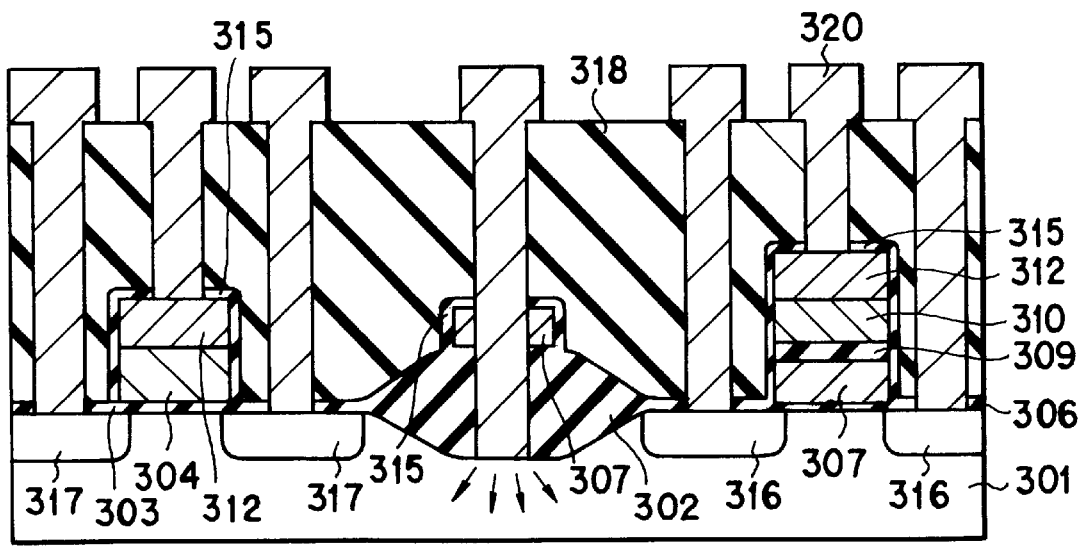
FIG. 3B is a cross sectional view for illustrating a manufacturing step following the manufacturing step of FIG. 3A.
Figure 4A:
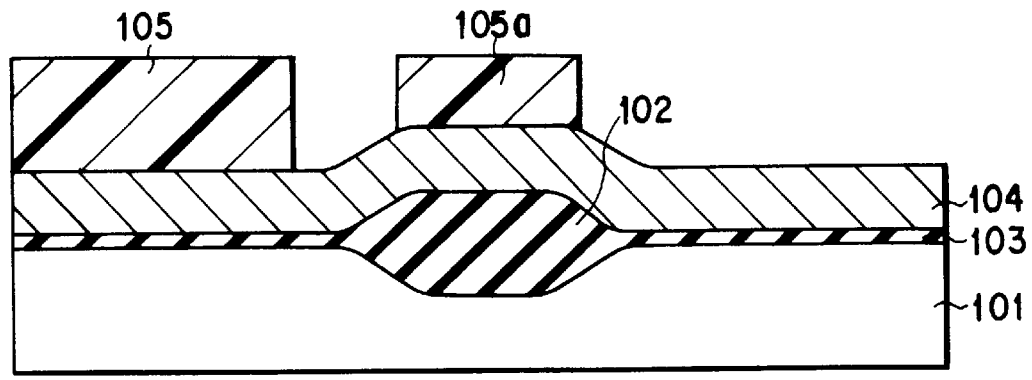
FIG. 4A is a cross sectional view for illustrating a one step of a process for manufacturing a nonvolatile memory according to a first embodiment of this invention.

First, as shown in FIG. 4A, a silicon oxide film ($SiO_2$ film) 103 with a thickness of 30 nm used for forming gate insulating films of the peripheral transistors is formed by dry oxidation at 950° C. on the surface of a P-type silicon substrate 101 on which an element isolation film 102 with a thickness of 700 nm is formed by a known LOCOS (local oxidation of silicon) method.

As the gate insulating film of the peripheral transistor, it is not always necessary to use the $SiO_2$ film 103 and a film obtained by subjecting a silicon oxide film to the thermal nitridation process, an SiN film or a composite film of $SiO_2$ film and SiN film may be used.

Then, a polysilicon film 104 used for forming the gate electrodes of the peripheral transistors and the resistance elements is formed to a thickness of 200 nm by a known LPCVD (low pressure chemical vapor deposition) method. After this, although not shown in the drawing, the impurity concentration of the polysilicon film 104 is set to a desired value by diffusion of phosphorus or ion-implantation of phosphorus ion.

Next, a resist pattern 105 is formed in a peripheral transistor forming area and a resist pattern 105a is formed in an area containing a contact forming area between a metal wiring layer (for example, aluminum wiring layer) and the resistance element by use of a known lithography technology. At this time, if the resist pattern 105a is larger than the contact portion of the aluminum wiring layer with the resistance element, it may be made smaller than the resistance element forming area.

Figure 4B:
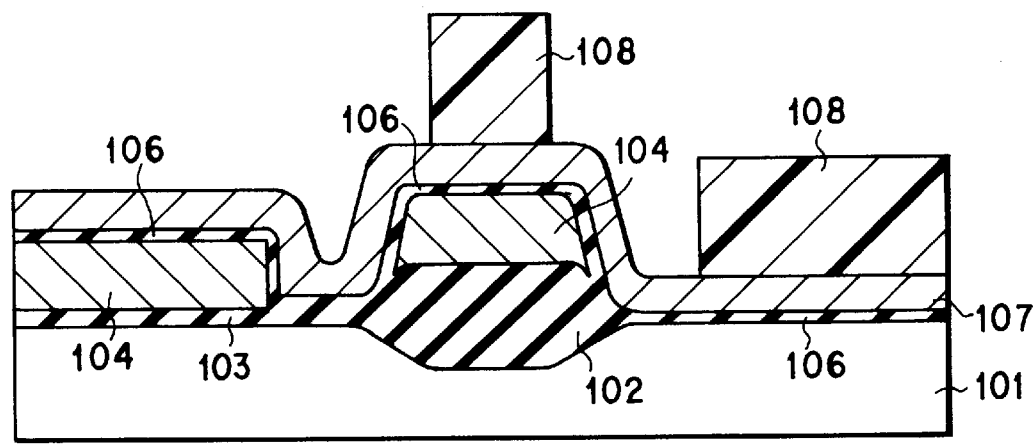
FIG. 4B is a cross sectional view for illustrating a manufacturing step following the manufacturing step of FIG. 4A.

After this, as shown in FIG. 4B, the polysilicon film 104 and silicon oxide film 103 are selectively etched with the resist patterns 105 and 105a used as a mask and then the resist patterns 105 and 105a are removed.

Next, as shown in FIG. 4B, a silicon oxide film 106 with a thickness of 10 nm used for forming the gate insulating films of the cell transistors is formed on the P-type silicon substrate 101 by dry oxidation at 800° C. At this time, the polysilicon film 104 is also oxidized and a thin silicon oxide film ($SiO_2$ film) 106 is formed on the surface of the polysilicon film 104.

As the gate insulating film of the cell transistor and the insulating film on the polysilicon film 104, it is not always necessary to use the $SiO_2$ film and a film obtained by subjecting a silicon oxide film to the thermal nitridation process, an SiN film or a composite film of $SiO_2$ film and SiN film may be used.

Next, a polysilicon film 107 used for forming the floating gates of the memory cells and the resistance elements is formed to a thickness of 100 nm by a known LPCVD method and, although not shown in the drawing, the impurity concentration of the polysilicon film 107 is set to a desired value by diffusion of phosphorus or ion-implantation of phosphorus ion. Then, a resist pattern 108 is formed in a forming area of the resistance elements and the floating gates of the memory cells.

Figure 4C:
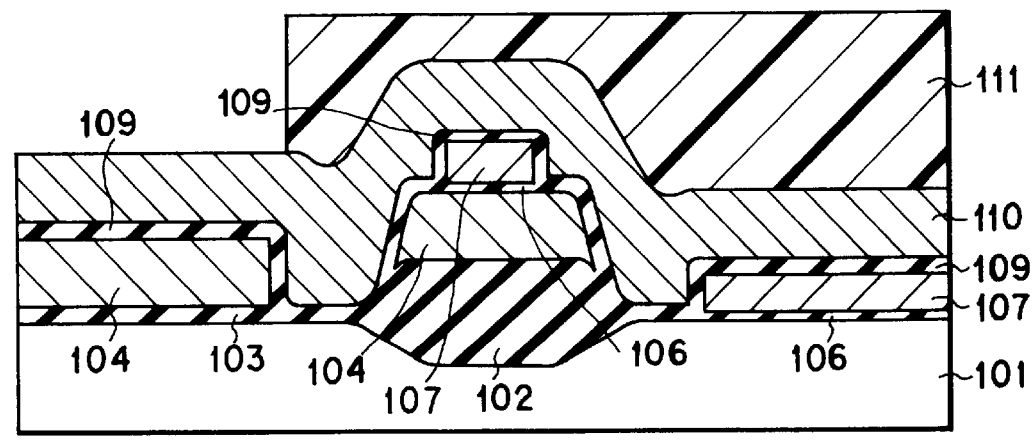
FIG. 4C is a cross sectional view for illustrating a manufacturing step following the manufacturing step of FIG. 4B.

After this, as shown in FIG. 4C, the polysilicon film 107 and silicon oxide film 106 are selectively etched with the resist pattern 108 used as a mask and then the resist pattern 108 is removed.

Next, as shown in FIG. 4C, a silicon oxide film 109 with a thickness of 20 nm is formed on the entire surface by dry oxidation at 800° C. and a polysilicon film 110 with a thickness of 200 nm used for forming the control gates of the memory cells is formed by the LPCVD method.

Figure 5A:
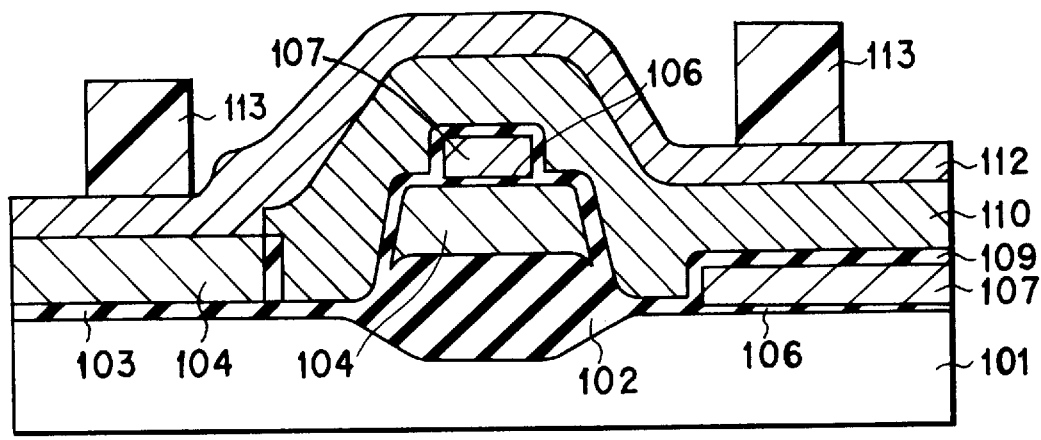
FIG. 5A is a cross sectional view for illustrating a manufacturing step following the manufacturing step of FIG. 4C.

After this, a resist pattern 111 is formed in an area other than the peripheral transistor forming area and, as shown in FIG. 5A, the silicon oxide film 109 and the polysilicon film 110 of the peripheral transistor forming area are selectively etched with the resist pattern 111 used as a mask and then the resist pattern 111 is removed.

Next, as shown in FIG. 5A, a refractory metal silicide film (for example, WSi film) 112 is formed to a thickness of 300 nm on the entire surface (not necessarily on the entire surface) by a known sputtering method and then a resist pattern 113 is formed on the peripheral transistor forming area and the memory cell forming area. It is possible to use a polysilicon film instead of the refractory metal silicide film 112 to serve the same purpose of reducing the wiring resistance of the gate electrode or it is possible to use refractory metal, for example, W.

Figure 5B:
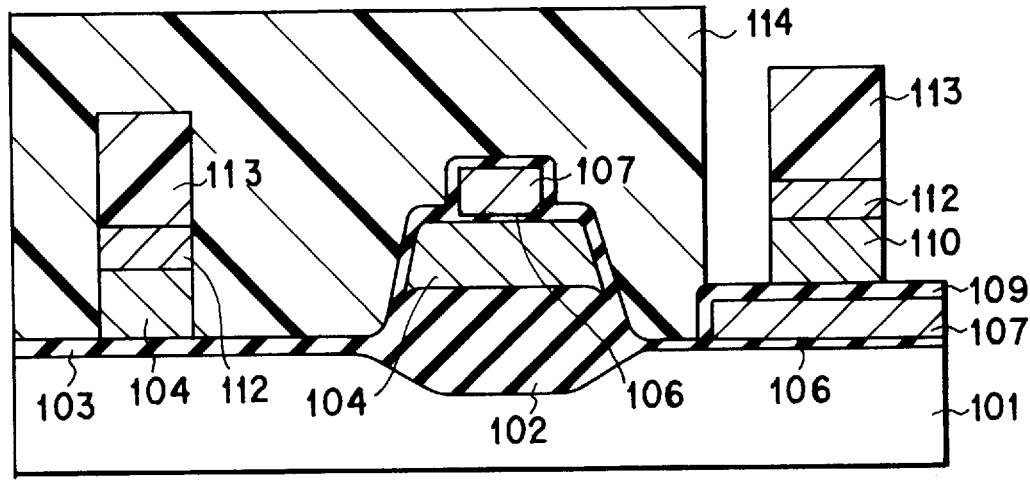
FIG. 5B is a cross sectional view for illustrating a manufacturing step following the manufacturing step of FIG. 5A.

After this, as shown in FIG. 5B, the polysilicon film 110 and the WSi film 112 in an area other than the memory cell forming area and the peripheral transistor forming area are selectively etched with the resist pattern 113 used as a mask.

Figure 5C:
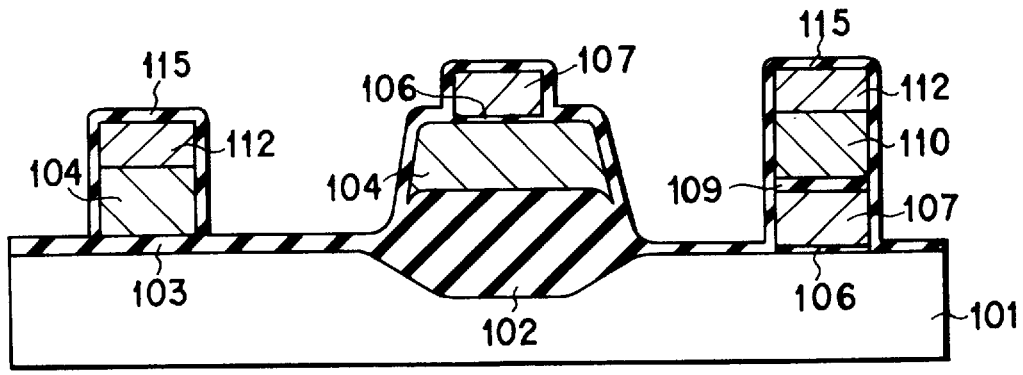
FIG. 5C is a cross sectional view for illustrating a manufacturing step following the manufacturing step of FIG. 5B.

Next, a resist pattern 114 is formed in an area other than the memory cell forming area while the resist pattern 113 is kept left behind, the silicon oxide film 109 and the polysilicon film 107 are selectively etched with the resist patterns 113 and 114 used as a mask as shown in FIG. 5C, and then the resist patterns 113 and 114 are removed.

After this, post-oxidation is effected to form silicon oxide films 115 on the surfaces of the peripheral transistor and memory cell as shown in FIG. 5C.

Then, as shown in FIG. 6A, diffusion layers 116 of the source and drain of the memory cell and diffusion layers 117 of the source and drain of the peripheral transistor are formed with desired impurity concentration. At this time, ion may be implanted into an area in which the polysilicon film 107 (including the aluminum wiring layer contact forming area) and polysilicon film 104 are formed so as to break down the dielectric property of the silicon oxide film 106 lying between the polysilicon films 107 and 104 of the aluminum wiring layer forming area and electrically connect the polysilicon films 107 and 104 to each other.

After this, a BPSG film 118 is formed as a passivation film to a thickness of 1.8 μm by the known CVD method. Then, a resist pattern 119 is formed in a contact forming area.

Next, as shown in FIG. 6B, contact holes are formed by selectively etching the BPSG film 118 with the resist pattern 119 used as a mask. Then, the resist pattern 119 is removed and aluminum wirings 120 are formed.

When the contact holes are formed in the BPSG film 118, the polysilicon film 107 which is an upper layer of the high-resistance element has a lower selective etching ratio with respect to the silicon oxide film 115 and is etched, but the polysilicon film 104 which is a lower layer thereof acts as an etching stopper so as to prevent a leakage current from flowing from the high-resistance element into the substrate.

In this case, the junction area between the polysilicon film 107 and the aluminum wiring layer 120 is reduced and the contact area therebetween becomes smaller. But if the polysilicon films 107 and 104 are electrically connected to each other in the previous step, the contact resistance between the resistance element and the aluminum wiring layer 120 can be determined by the sum of the junction area between the polysilicon film 107 and the aluminum wiring layer 120 and the junction area between the polysilicon film 104 and the aluminum wiring layer 120. Therefore, the contact resistance between the resistance element and the aluminum wiring layer 120 can be lowered.

Figure 6C:
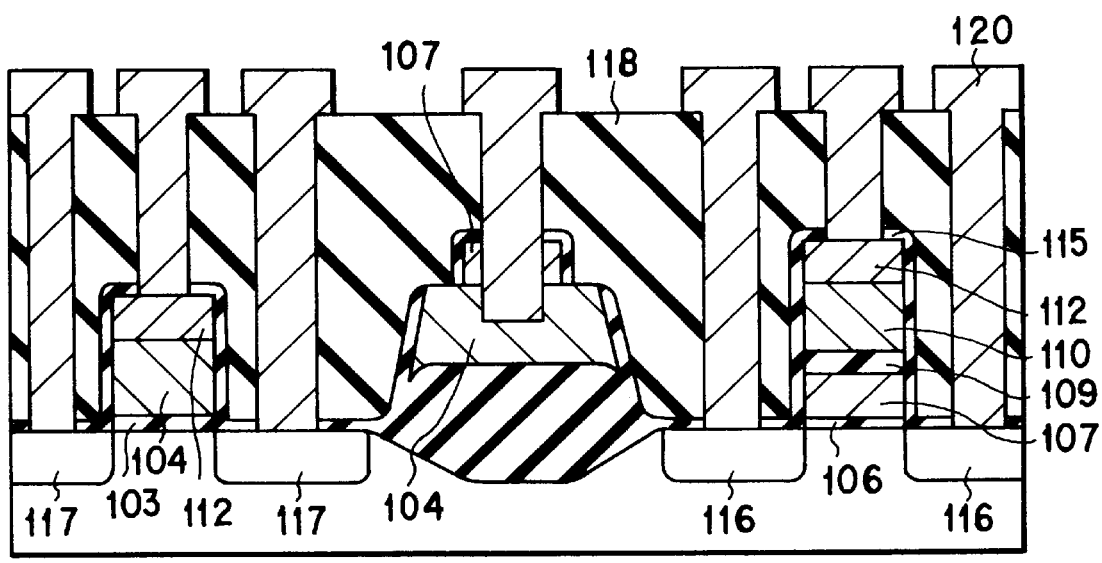
FIG. 6C is a cross sectional view for illustrating a manufacturing step in another embodiment.

Further, if it is desired to further lower the contact resistance, the silicon oxide film 106 lying between the polysilicon films 107 and 104 may be removed by etching as shown in FIG. 6C.

The polysilicon film 104 acting as the etching stopper described before can be formed simply by modifying the mask pattern used for forming the resist patterns 105 and 105a without additionally using a special step.

That is, the contact of the aluminum wiring layer can be easily formed on the thin film floating gate without increasing the number of steps.

In other words, in the first embodiment described above, when contact holes are formed in the BPSG film 118 and the insulating film 109 on the polysilicon film 107, the contact holes can be prevented from extending into the underlying substrate by the presence of the etching stopper film 104 even if the contact holes penetrate the resistance element using the thin film polysilicon film 107 by previously forming the etching stopper film 104 having a selective etching ratio with respect to the insulating film 109 via the insulating film 106 in an area lying directly under the contact hole. Therefore, it becomes possible to reduce the film thickness of the polysilicon film 107 for the resistance element to a desired film thickness which is necessary for attaining the high-speed operation and high reliability.

In the structure of the nonvolatile memory manufactured by the above method, if the contact hole extends into the etching stopper film 104, the contact area between the polysilicon film 107 and the wiring layer connected thereto is sharply reduced and the contact resistance therebetween greatly increases. There occurs no problem if sufficiently high resistance is required for the high-resistance element, and if somewhat lower resistance is required for the high-resistance element, it is possible to suppress an increase in the contact resistance between the high-resistance element and the wiring layer connected thereto by taking the following measures (1) and (2).

(1) The dielectric property of the silicon oxide film 106 lying between the polysilicon film 107 and the etching stopper film 104 is broken down to electrically connect the polysilicon film 107 and the etching stopper film 104 to each other.

(2) The polysilicon film 107 is laminated on at least part of the etching stopper film 104 to electrically connect the polysilicon film 107 and the etching stopper film 104 to each other.

Further, since part of the polysilicon film 104 used in the gate electrode wiring layer of the MOS transistor formed on the same substrate is used when the etching stopper film 104 is formed, it is not necessary to additionally deposit special polysilicon, the number of manufacturing steps is not increased and the manufacturing cost will not rise.

FIGS. 7A to 9 show part of the substrate cross section in the main steps of a method for manufacturing a semiconductor device according to the second embodiment of this invention.

The semiconductor device uses two types of polysilicon films in the peripheral circuit, and HV transistors (for example, peripheral transistors) to which a high power source voltage is applied, LV transistors to which a power source voltage lower than the power source voltage applied to the HV transistors is applied, and resistance elements used for setting a power source voltage on which the LV transistors can be operated are formed on the same substrate.

Next, the manufacturing process for the above semiconductor device is explained.

First, as shown in FIG. 7A, a silicon oxide film ($SiO_2$ film) 203 with a thickness of 30 nm used for forming the gate insulating films of the peripheral transistors is formed by dry oxidation at 950° C. on the surface of a P-type silicon substrate 201 on which an element isolation film 202 with a thickness of 700 nm is formed by a known LOCOS method.

As the gate insulating film of the peripheral transistor, it is not always necessary to use the $SiO_2$ film 203 and a film obtained by subjecting a silicon oxide film to the thermal nitridation process, an SiN film or a composite film of $SiO_2$ film and SiN film may be used.

Then, a polysilicon film 204 used for forming the gate electrodes of the peripheral transistors and the resistance elements is formed to a thickness of 200 nm by a known LPCVD method. After this, although not shown in the drawing, the impurity concentration of the polysilicon film 204 is set to a desired value by diffusion of phosphorus or ion-implantation of phosphorus ion.

Next, a resist pattern 205 is formed in a peripheral transistor forming area and a resist pattern 105a is formed in an area containing a forming area of contacts between a metal wiring layer (for example, aluminum wiring layer) and the resistance elements by use of a known lithography technology. If the resist pattern 205a is larger than the aluminum wiring layer contact portion of the resistance element, it may be made smaller than the resistance element forming area.

After this, as shown in FIG. 7B, the polysilicon film 204 and silicon oxide film 203 are selectively etched with resist patterns 205 and 205a used as a mask and then the resist patterns 205 and 205a are removed.

Next, as shown in FIG. 7B, a silicon oxide film 206 with a thickness of 10 nm used for forming the gate insulating films of the cell transistors is formed on the P-type silicon substrate 201 by dry oxidation at 800° C. At this time, the polysilicon film 204 is also oxidized and a thin silicon oxide film ($SiO_2$ film) 206 is formed on the surface of the polysilicon film 204.

As the gate insulating film of the cell transistor and the insulating film on the polysilicon film 204, the $SiO_2$ film is not necessarily used and a film obtained by subjecting a silicon oxide film to the thermal nitridation process, an SiN film or a composite film of SiO$_2$ film and SiN film may be used.

Next, a polysilicon film 207 used for forming the gate electrodes of the LV transistors and the resistance elements is formed to a thickness of 100 nm by a known LPCVD method and, although not shown in the drawing, the impurity concentration of the polysilicon film 207 is set to a desired value by diffusion of phosphorus or ion-implantation of phosphorus ion. Then, a resist pattern 208 is formed in a forming area of the LV transistors and the resistance elements.

After this, as shown in FIG. 7C, the polysilicon film 207 and silicon oxide film 206 are selectively etched with the resist pattern 208 used as a mask and then the resist pattern 208 is removed.

Then, although not shown in the drawing, impurity is ion-implanted in an area of the resistance element in which the polysilicon film 204 and the polysilicon film 207 (including the aluminum wiring layer contact forming area) are formed to break down the dielectric property of the silicon oxide film 206 lying between the polysilicon films 207 and 204 and electrically connect the polysilicon films 207 and 204 to each other.

Next, as shown in FIG. 7C, an SiO$_2$ film is formed on the entire surface (not necessarily on the entire surface) and patterned to form an SiO$_2$ film 209 in the resistance element forming area by use of a resist pattern (not shown).

After this, the impurity concentration of the polysilicon films 204 and 207 is set to a desired value by ion-implantation of phosphorus ion. At this time, the resistance element forming area is covered with the SiO$_2$ film 209 and no impurity is doped therein.

Next, as shown in FIG. 8A, a refractory metal silicide film (for example, WSi film) 210 is formed to a thickness of 300 nm on the entire surface (not necessarily on the entire surface) by a known sputtering method and then a resist pattern 211 is formed on the LV transistor forming area and the HV transistor forming area.

After this, as shown in FIG. 8B, the WSi film 210 and the polysilicon film 207 are selectively etched with the resist pattern 211 used as a mask and then the resist pattern 211 is removed.

Next, post-oxidation is effected to form silicon oxide films 212 on the surfaces of the LV transistor and HV transistor as shown in FIG. 8B. Then, as shown in FIG. 8C, diffusion layers 213 of the source and drain regions are formed with desired impurity concentration.

After this, a BPSG film 214 is formed as a passivation film to a thickness of 1.8 $\mu$m by the known CVD method. Then, a resist pattern 215 is formed in a contact forming area.

Figure 9:
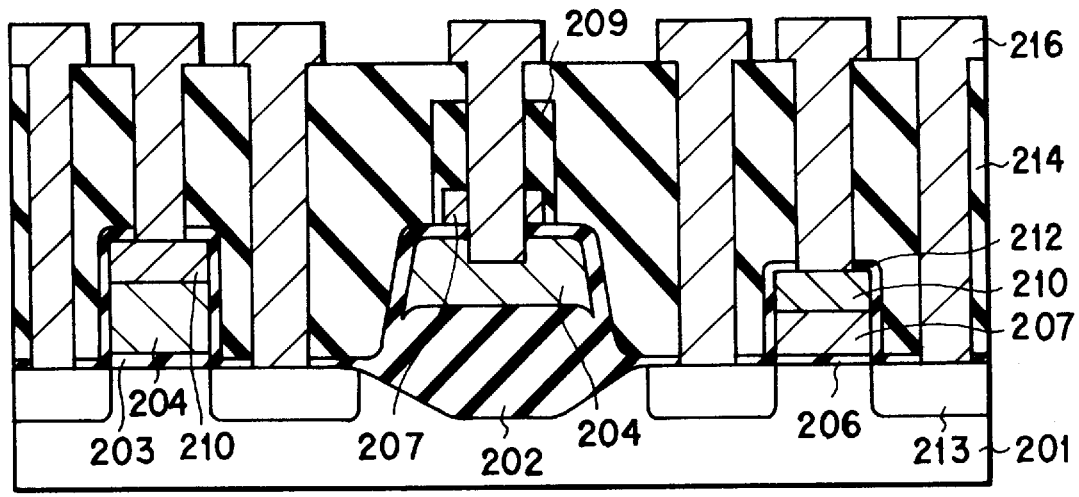
FIG. 9 is a cross sectional view for illustrating a manufacturing step following the manufacturing step of FIG. 8C.

Next, as shown in FIG. 9, contact holes are formed by selectively etching the BPSG film 214 with the resist pattern 215 used as a mask. Then, the resist pattern 215 is removed and aluminum wirings 216 are formed.

When the contact holes are formed in the BPSG film 214, the polysilicon film 207 which is an upper layer of the high-resistance element has a lower selective etching ratio with respect to the silicon oxide film 209 and is etched, but the polysilicon film 204 which is a lower layer thereof acts as an etching stopper so as to prevent a leakage current from flowing from the high-resistance element into the substrate.

In this case, the junction area between the polysilicon film 207 and the aluminum wiring layer 216 is reduced and the contact area therebetween becomes smaller, but since the polysilicon films 207 and 204 are electrically connected to each other in the previous step and the contact resistance between the resistance element and the aluminum wiring layer can be determined by the sum of the junction area between the polysilicon film 207 and the aluminum wiring layer 216 and the junction area between the polysilicon film 204 and the aluminum wiring layer 216, the contact resistance between the resistance element and the aluminum wiring layer can be lowered.

Figure 10:
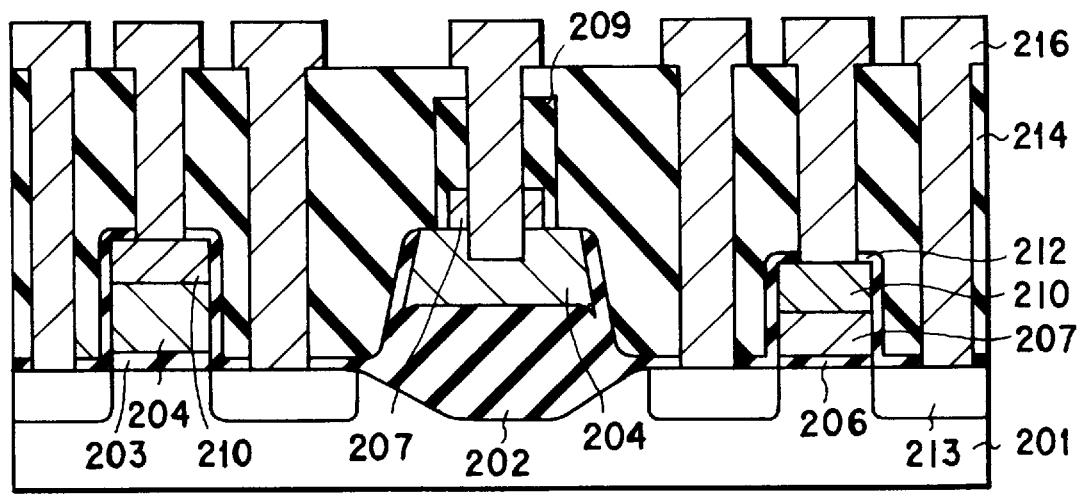
FIG. 10 is a cross sectional view for illustrating a manufacturing step in another embodiment.

Further, if it is desired to further lower the contact resistance, the silicon oxide film 206 lying between the polysilicon films 207 and 204 may be removed by etching as shown in FIG. 10.

The polysilicon film 204 acting as the etching stopper described before can be easily formed by modifying the mask pattern used for forming the resist patterns 205 and 205a and adding an ion-implantation step of lowering the contact resistance between the resistance element and the aluminum wiring layer.

That is, in the second embodiment, the contact portion of the aluminum wiring layer can be more easily formed on the thin film polysilicon film 207 in comparison with the conventional case simply by adding an ion-implantation step of lowering the contact resistance between the resistance element and the aluminum wiring layer.

In the second embodiment described above, the polysilicon film for the LV transistor is used as the high-resistance element and the polysilicon film for the HV transistor is used as the etching stopper, but when the polysilicon film for the HV transistor is used as the high-resistance element, the same effect can be attained by using the polysilicon film for the LV transistor as the etching stopper.

Figure 11:
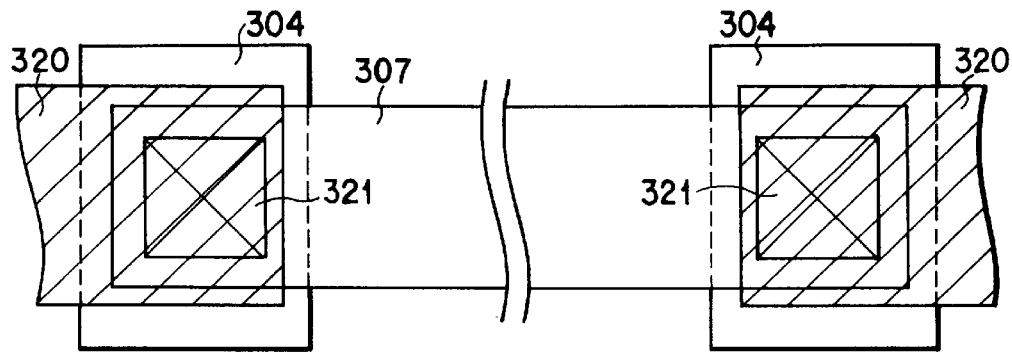
FIG. 11 is a top plan view showing a third embodiment.

FIG. 11 is a top plan view showing a third embodiment in which this invention is applied to a terminal of a resistance element. That is, in FIG. 11, a reference numeral 307 denotes a resistor formed of a thin silicon film and connected at both ends to aluminum connection lines 320. Portions of the silicon film 307 of the resistor lie under contact holes 321 and etching stopper films 304 are formed under the corresponding portions of the silicon film 307. The etching stopper film prevents penetration of the aluminum connection line 320 into the silicon substrate and permits a contact portion between the aluminum wiring layer and the resistor 307 to be easily attained.

Figure 12A:
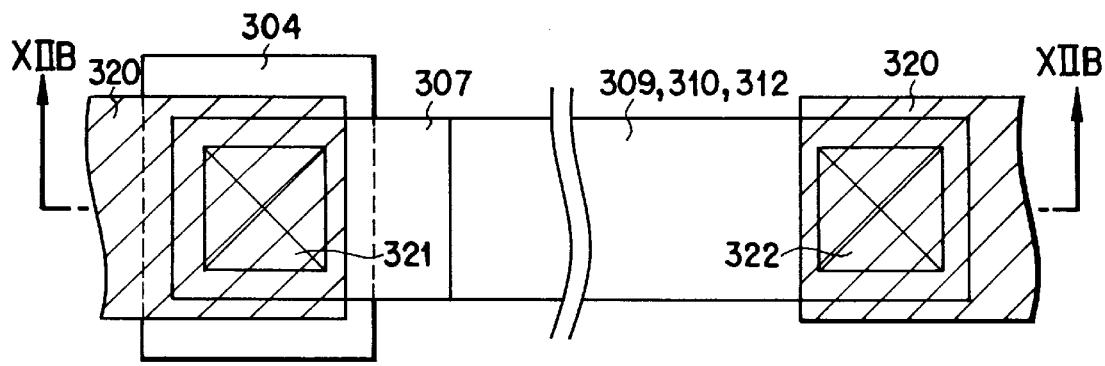
FIGS. 12A and 12B are a top plan view and cross sectional view showing a fourth embodiment.
Figure 12B:
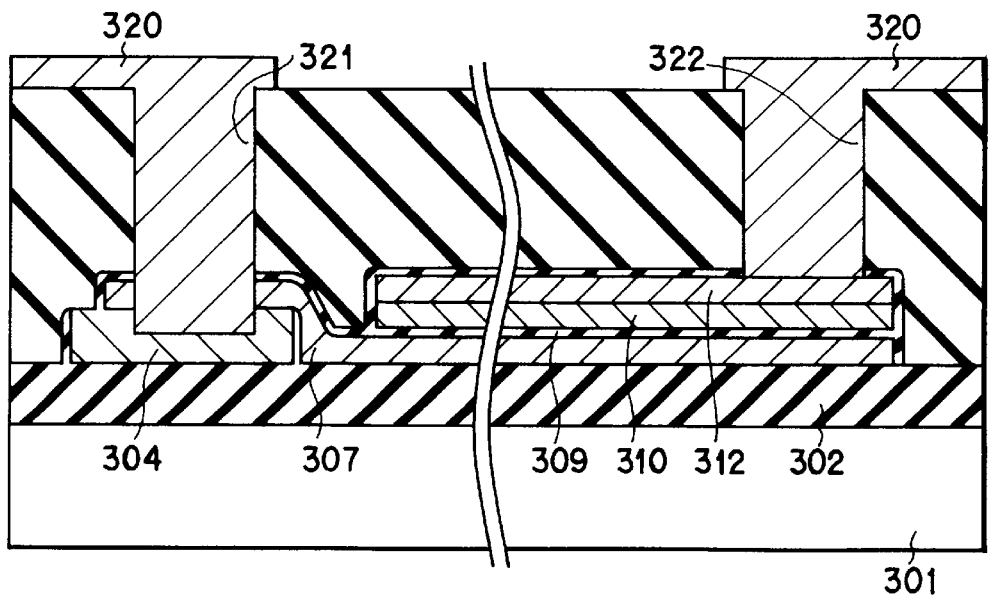

FIGS. 12A and 12B are a top plan view and cross sectional view showing a fourth embodiment in which this invention is applied to a terminal of a capacitor element. That is, a reference numeral 307 denotes a thin silicon film constructing a lower electrode of the capacitor and a reference numeral 310 denotes a thin silicon film constructing an upper electrode of the capacitor. A reference numeral 309 denotes a silicon oxide film acting as a capacitor insulating film between the upper and lower electrodes. The lower electrode 307 is connected at the left end portion to an aluminum wiring 320 and the upper electrode 310 is connected at the right end portion to an aluminum wiring 320. A portion of the silicon film 307 of the lower electrode lies under a contact hole 321 and an etching stopper film 304 lies under the corresponding portion of the silicon film 307. The etching stopper film prevents penetration of the aluminum connection line 320 into the silicon substrate and permits a contact portion between the aluminum wiring layer and the lower electrode 307 to be easily attained. The upper electrode 310 is connected to the aluminum wiring 320 via a silicide film 312 in a right-side contact hole 322. In this case, for the capacitor insulating film 309 the silicon oxide film 109 shown in FIG. 4C may be used. Furthermore, for the upper electrode 310 the polysilicon film 110 shown in FIG. 4C may be used, and for the silicide film 312 the refractory metal silicide film 112 shown in FIG. 5A may be used respectively. The capacitor element can be used not only as one element for constructing part of a device but also as a film thickness monitor (for managing the film thickness of an oxide film by measurement of the capacitance) for managing the process and is useful for preventing occurrence of problems in the manufacturing process.

As described above, according to this invention, it is possible to provide a semiconductor device and a method for manufacturing the same in which a thin film polysilicon film having a small parasitic capacitance which is required for attaining the high-speed operation and high reliability can be used as a resistance element, the process margin can be enlarged without increasing the number of manufacturing steps, and defects due to leakage between the resistance element and the underlying substrate can be eliminated so as to ensure the high manufacturing yield.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A method for manufacturing a semiconductor device comprising the steps of:
    forming a first insulating film on a surface of a semiconductor substrate;
    forming a first polysilicon film used for forming an etching stopper film on said first insulating film;
    forming a first resist pattern on an etching stopper film area;
    removing a portion of said first polysilicon film which lies in an area other than said etching stopper film forming area and patterning said etching stopper film with said first resist pattern used as a mask;
    removing said first resist pattern;
    forming a second polysilicon film above said semiconductor substrate and said etching stopper film;
    forming a second resist pattern used for patterning said second polysilicon film;
    patterning said second polysilicon film with said second resist pattern used as a mask;
    removing said second resist pattern and then forming an inter-level insulating film on the surface;
    forming a contact hole so as to extend through said inter-level insulating film and said second polysilicon film, and into said etching stopper film; and
    forming a conductive layer in said contact hole so as to be in contact with said second polysilicon film and engaged in said etching stopper film.

2. A method for manufacturing a semiconductor device according to claim 1, wherein said second polysilicon film is a polysilicon film having impurity previously doped therein.

3. A method for manufacturing a semiconductor device according to claim 1, further comprising a step of doping impurity into said second polysilicon film.

4. A method for manufacturing a semiconductor device according to claim 1, further comprising a step of forming a second insulating film above said semiconductor substrate and said etching stopper film which is effected between said step of removing said first resist pattern and said step of forming said second polysilicon film.

5. A method for manufacturing a semiconductor device according to claim 4, further comprising a step of removing part of said second insulating film which lies on said etching stopper film.

6. A method for manufacturing a semiconductor device comprising the steps of:
    forming a first insulating film on a semiconductor substrate;
    forming a first polysilicon film used for forming an etching stopper film on said first insulating film;
    forming a first resist pattern on an etching stopper film forming area;
    removing a portion of said first polysilicon film which lies in an area other than said etching stopper film forming area and patterning said etching stopper film with said first resist pattern used as a mask;
    removing said first resist pattern and then sequentially forming a second insulating film and a second polysilicon film above said semiconductor substrate and said etching stopper film;
    ion-implanting impurity into part of an area in which said etching stopper film, second insulating film and second polysilicon film are formed to break down the dielectric property of said second insulating film lying between said etching stopper film and said second polysilicon film;
    forming a second resist pattern used for patterning said second polysilicon film;
    patterning said second polysilicon film with said second resist pattern used as a mask;
    removing said second resist pattern and then forming an inter-level insulating film on the entire surface;
    forming a contact hole which reach said second polysilicon film lying directly above said etching stopper film in said inter-level insulating film; and
    forming a metal wiring layer which is formed in contact with said second polysilicon film via said contact hole in said inter-level insulating film.

7. A method for manufacturing a semiconductor device according to claim 6, wherein said second polysilicon film is a polysilicon film having impurity previously doped therein.

8. A method for manufacturing a semiconductor device according to claim 6, further comprising a step of doping impurity into said second polysilicon film.

9. A method for manufacturing a semiconductor device including first and second MOS transistors having first and second gate insulation films with different film thicknesses and a resistance element or a capacitor element which is formed on the same semiconductor substrate, comprising the steps of:
    forming an element isolation insulating film and said first gate insulating film for said first MOS transistor on said semiconductor substrate;
    forming a first polysilicon film used for forming an etching stopper film and a gate electrode of said first MOS transistor on said element isolation insulating film and said first gate insulating film;
    forming a first resist pattern on an etching stopper film forming area and a forming area of the gate electrode of said first MOS transistor;

selectively removing said first polysilicon film and said first gate insulating film with said first resist pattern used as a mask;

removing said first resist pattern and then forming said second gate insulating film having a film thickness different from that of said first gate insulating film on said semiconductor substrate and said first polysilicon film;

forming a second polysilicon film used for forming a gate electrode of said second MOS transistor and said resistance element or a capacitor electrode of said capacitor element on said second gate insulating film;

forming a second resist pattern used for patterning said second polysilicon film;

patterning said second polysilicon film with said second resist pattern used as a mask, and then removing said second resist pattern;

forming a third resist pattern in an area in which the gate electrodes of said first and second MOS transistors and said resistance element or said capacitor electrode are formed;

forming the gate electrode of said first MOS transistor and the gate electrode of said second MOS transistor and forming said resistance element or said capacitor electrode with said third resist pattern used as a mask;

forming source and drain regions of said first MOS transistor;

forming source and drain regions of said second MOS transistor;

forming an inter-level insulating film on the entire surface;

forming a contact hole which reach said second polysilicon film lying directly above said etching stopper film in said inter-level insulating film; and forming a metal wiring layer which is formed in contact with said second polysilicon film via said contact hole in said inter-level insulating film.

10. A method for manufacturing a semiconductor device according to claim 9, further comprising a step of ion-implanting impurity into part of an area in which said etching stopper film, said second gate insulating film and said second polysilicon film are formed to break down dielectric property of that part of said second gate insulating film between said etching stopper film and said second polysilicon film, which is effected after said step of forming said second polysilicon film.

11. A method for manufacturing a semiconductor device according to claim 9, further comprising a step of removing part of said second gate insulating film formed on said etching stopper film.

12. A method for manufacturing a semiconductor device according to claim 9, further comprising a step of forming a conductive film on said gate electrode of said first MOS transistor and said gate electrode of said second MOS transistor.

13. A method for manufacturing a semiconductor device including a MOS transistor and a two-layered polysilicon type memory cell transistor having gate insulation films with different film thicknesses respectively and a resistance element or a capacitor element which are formed on the same semiconductor substrate, comprising the steps of:

forming an element isolation insulating film and a first gate insulating film for said gate insulating film of said MOS transistor on said semiconductor substrate;

forming a first polysilicon film used for forming an etching stopper film and a gate electrode of said MOS transistor on said element isolation insulating film and said first gate insulating film;

forming a first resist pattern on an etching stopper film forming area and a forming area of the gate electrode of said MOS transistor;

selectively removing said first polysilicon film and said first gate insulating film with said first resist pattern used as a mask;

removing said first resist pattern and then forming a second gate insulating film for said gate insulating film of said memory cell transistor having a film thickness different from that of said first gate insulating film on semiconductor substrate and said first polysilicon film;

forming a second polysilicon film used for forming a floating a gate electrode of said memory cell transistor and said resistance element or a capacitor electrode of said capacitor element on said second gate insulating film;

forming a second resist pattern at least in an area in which said resistance element or said capacitor electrode and the gate electrode of said memory cell transistor are formed;

selectively etching said second polysilicon film and said second gate insulating film with said second resist pattern used as a mask to form said resistance element or said capacitor electrode;

removing said second resist pattern and then forming a third insulating film on the entire surface;

forming a third polysilicon film used for forming a control gate electrode of said memory cell transistor on the entire surface;

forming a third resist pattern in an area other than the forming area of the gate electrode of said MOS transistor;

selectively etching said third polysilicon film, said third insulating film and said second gate insulating film and to expose the surface of said first polysilicon film in the forming area of the gate electrode of said MOS transistor with said third resist pattern used as a mask;

removing said third resist pattern and then forming a conductive film on the entire surface;

forming a fourth resist pattern at least in an area in which the gate electrode of said memory cell transistor is formed and an area in which the gate electrode of said MOS transistor is formed;

selectively etching said conductive film, said first polysilicon film and said third polysilicon film with said fourth resist pattern used as a mask to form the gate electrode of said MOS transistor and the control gate electrode of said memory cell transistor;

forming a fifth resist pattern in an area other than the memory cell transistor forming area;

selectively etching said third insulating film and said second polysilicon film with said fourth and fifth resist patterns used as a mask to form the floating gate electrode of said memory cell transistor;

removing said fourth and fifth resist patterns;

forming source and drain regions of said MOS transistor;

forming source and drain regions of said memory cell transistor;

forming an inter-level insulating film on the entire surface;

forming a contact hole which reach said second polysilicon film lying directly above said etching stopper film in said inter-level insulating film; and forming a metal wiring layer which is formed in contact with said second polysilicon film via said contact hole in said inter-level insulating film.

14. A method for manufacturing a semiconductor device according to claim 13, further comprising a step of ion-implanting impurity into part of an area in which said etching stopper film, said second gate insulating film and said second polysilicon film are formed to break down dielectric property of that part of said second gate insulating film between said etching stopper film and said second polysilicon film, which is effected after said step of forming said second polysilicon film.

15. A method for manufacturing a semiconductor device according to claim 13, further comprising a step of removing part of said second gate insulating film formed on said etching stopper film.

16. A method for manufacturing a semiconductor device according to claim 13, wherein said third insulating film is used for a capacitor insulating film of said capacitor element.

17. A method for manufacturing a semiconductor device according to claim 13, wherein said third polysilicon film and said conductive film are used for an opposing electrode to the capacitor electrode of said capacitor element.

18. A method for manufacturing a semiconductor device according to claim 17, wherein said opposing electrode is formed by said step of selectively etching said conductive film, said first polysilicon film and said third polysilicon film.

\* \* \* \* \*